United States Patent [19]
Stanojevic

[11] Patent Number: 5,910,739
[45] Date of Patent: Jun. 8, 1999

[54] POWER-UP/INTERRUPT DELAY TIMER

[75] Inventor: Silvo Stanojevic, Milpitas, Calif.

[73] Assignee: Exar Corporation, Fremont, Calif.

[21] Appl. No.: 09/065,390

[22] Filed: Apr. 23, 1998

Related U.S. Application Data

[63] Continuation of application No. 08/633,145, Apr. 16, 1996, Pat. No. 5,818,271.

[51] Int. Cl.$^6$ ................................................. H03K 17/22
[52] U.S. Cl. ............................ 327/143; 327/198; 327/215
[58] Field of Search ................................. 327/143, 198, 327/315, 215, 538, 543; 323/312, 315

[56] References Cited

U.S. PATENT DOCUMENTS

| | | | |
|---|---|---|---|
| 4,495,425 | 1/1985 | McKenzie | 323/315 |
| 4,683,414 | 7/1987 | Moore | 323/315 |
| 4,766,335 | 8/1988 | Shiraishi et al. | 327/198 |
| 5,083,079 | 1/1992 | Plants | 323/313 |
| 5,164,613 | 11/1992 | Mumper et al. | 327/143 |
| 5,369,310 | 11/1994 | Badyal et al. | 327/198 |
| 5,469,099 | 11/1995 | Konishi | 327/198 |
| 5,519,346 | 5/1996 | Haddad | 327/198 |
| 5,528,182 | 6/1996 | Yokosaw | 327/198 |
| 5,528,184 | 6/1996 | Gola et al. | 327/198 |

FOREIGN PATENT DOCUMENTS

| | | | |
|---|---|---|---|
| 59-154821 | 9/1984 | Japan | 327/143 |

*Primary Examiner*—Terry D. Cunningham
*Attorney, Agent, or Firm*—Townsend and Townsend and Crew LLP

[57] ABSTRACT

A delay for short power interruptions by using a first comparator to compare the power supply voltage to a voltage reference. A second comparator has a first input coupled to the same voltage reference, and an output which generates the reset signal. A capacitor coupled to the second input of the second comparator determines when a reset signal is issued. The capacitor is normally charged by a current source. When the power supply falls below a set point indexed to the reference voltage, as indicated by the first comparator, a discharging circuit discharges the capacitor. The rate at which the capacitor is discharged and the threshold of the second comparator determines how long of a power interrupt is required to issue a reset signal. In the preferred embodiment, the discharging circuit is a latching current source. The current source is latched into the on position by the output of the comparator, and is reset when the comparator indicates that the voltage supply is returned to normal. When reset, the discharging current source is turned off.

4 Claims, 2 Drawing Sheets

POWER-UP/INTERRUPT DELAY TIMER

This application is a continuation of and claims the benefit of U.S. application Ser. No. 08/633,145, filed Apr. 16, 1996 now U.S. Pat. No. 5,818,271, the disclosure of which is incorporated by reference.

BACKGROUND OF THE INVENTION

The present invention relates to reset circuits for providing a reset signal, and in particular to such a circuit incorporating a delay.

In electrical systems power interruptions are common. A sophisticated system contains power-on and low voltage detection delayed reset circuitry to provide a reset signal following the turn-on of power or a power interruption. The low voltage detection circuit resets a power-on delay timer, and thus upon power restoration the delay reset functions as though the power has just been turned on. The disadvantage in this approach is that a very short power interruption pulse causes a completely new reset cycle, causing the entire system to be reset, which can take a very long time depending on the system design.

In actual applications many loads have long L/R or RC time constants which cannot respond in the short time that the power interruption lasts, and there is no danger from a short interruption. However, once the reset is issued the loads are forced to go through the reset sequence. In some applications this institutes the entire reset process, which may be lengthy. For example, in systems where a microprocessor is used, the entire start up procedure needs to be reinitiated, which may require human interaction. An example that is very common is when a PC resets during a power surge. After such an incident one needs to restart all applications and in some cases redo extensive work if there was no recent save.

The prior art XR8000 chip contains a 5V regulator featuring power on delay, low voltage detect and a watchdog timer. The XR8000 issues a reset signal on power up and low voltage detect. Hence, since most power interrupts produce low voltage detection, a reset signal is issued upon every power interrupt.

In many cases, during a very short power interruption, the regulated supply voltage drops by a small amount, but it remains within the specified operating range for the microprocessor, which means that if the processor were to simply store its status as soon as the power interruption occurs and goes into standby mode for the duration of the interrupt, operating conditions can be restored as soon as the power is restored. If the power interrupt exceeds a predetermined time that causes the regulated supply to fall below the specified operating range, a normal reset could be issued.

SUMMARY OF THE INVENTION

The circuit presented in this invention performs a standard power-on reset function and a power interrupt resume function. The power interrupt resume function is initiated whenever a power interruption occurs, and is effected only if the power interruption is shorter than the preset interrupt time. Thus, for the power interrupts that are shorter than the preset interrupt time, no power-on delay is initiated, which means that the system resumes working as soon as power is restored without going through the power-on delay.

The Power-Up/Interrupt Delay Timer of the present invention will allow power interrupts shorter than 10-msec without initiating the power on delay timer, hence there will be no system reset for these short pulses. For interrupts longer than 10-msec, the Power-Up/Interrupt Delay Timer will behave in the same manner as the XR8000 or any other system with a power on delay timer, during power up or power interrupt conditions.

The present invention provides a delay for short power interruptions by using a first comparator to compare the power supply voltage to a voltage reference. A second comparator has a first input coupled to the same voltage reference, and an output which generates the reset signal. A capacitor coupled to the second input of the second comparator determines when a reset signal is issued. The capacitor is normally charged by the reference voltage. When the power supply falls below a set point indexed to the reference voltage, as indicated by the first comparator, a discharging circuit discharges the capacitor. The rate at which the capacitor is discharged and the threshold of the second comparator determines how long of a power interrupt is required to issue a reset signal.

In the preferred embodiment, the discharging circuit is a latching current source. The current source is latched into the on position by the output of the comparator, and is reset when the comparator indicates that the voltage supply is returned to normal. When reset, the discharging current source is turned off.

In a preferred embodiment, the latching current source has a PNP current source transistor with multiple collectors configured as a first current mirror. A set transistor has a base coupled as a set input and is connected to a pair of multiple collectors of the PNP transistor as a first leg of the current mirror. A second current mirror circuit comprising two NPN transistors is connected to a second leg of the first current mirror, preferably two collectors of the PNP transistor. A reset transistor is coupled to a base of the second current mirror.

For a fuller understanding of the nature and advantages of the invention, reference should be made to the following description taken in conjunction with the accompanying drawings.

DETAILED DESCRIPTION OF THE PREFERRED EMBODIMENTS

Figure 1:
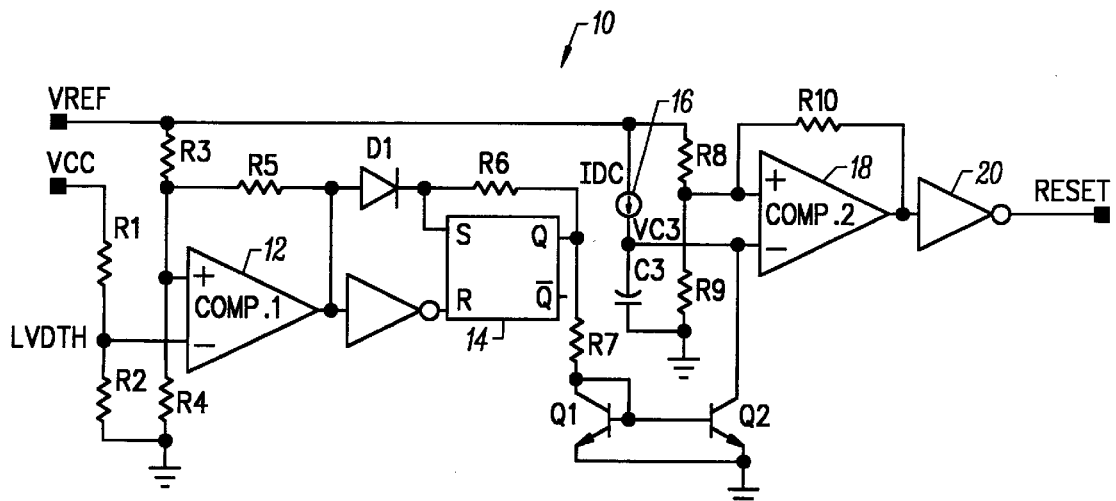
FIG. 1 is a block diagram of a reset circuit according to the present invention.

FIG. 1 is a block diagram of one embodiment of a reset circuit according to the present invention. The supply voltage, VCC, is provided through a resistor divider of resistors R1 and R2 to a negative input of a first comparator 12. The voltage at the junction of the resistor divider is the low voltage detect threshold (LVDTH). A voltage reference signal, preferably provided by a separate voltage regulator, is provided through a resistor divider of resistors R3 and R4 to a positive input of comparator 12. The output of comparator 12 is provided through an invertor to a reset input of a latch 14.

A capacitor C3 is charged by a charging circuit 16, preferably a current source, connected to the voltage reference signal, VREF. Capacitor C3 is connected to a negative input of a second comparator 18. The positive input of comparator 18 is connected through a resistor R8 to the voltage reference. The output of comparator 18 is connected through an invertor 20 to provide the reset signal. The voltage on capacitor C3 is indicated as VC3.

A current source consisting of transistors Q1 and Q2 is activated by latch 14 to discharge capacitor C3 upon being set by a set input provided from the output of comparator 12 through a diode D1. This happens when the VCC supply voltage falls below the desired tolerance levels. When the supply voltage returns to its normal state, the reset input of latch 14 turns off the current source of Q1 and Q2, allowing C3 to be charged up again by charging circuit 16.

Figure 2:
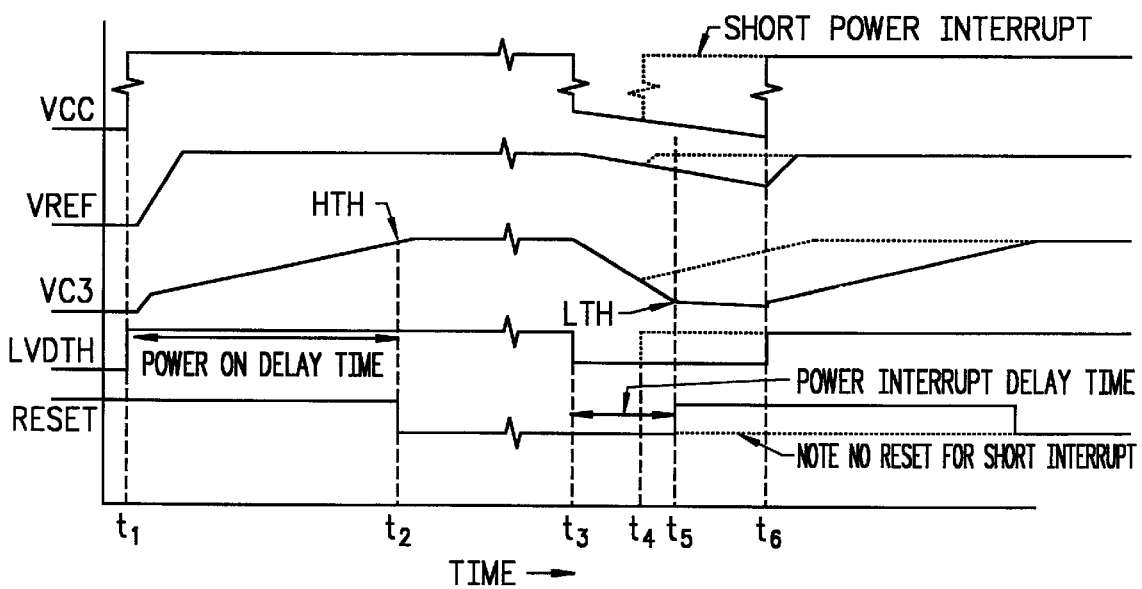
FIG. 2 is a timing diagram illustrating several signals of the circuit of FIG. 1.

FIG. 2 illustrates the waveforms for several of the signals of FIG. 1. At a first time, t1, the power supply VCC is brought up. The VREF signal slowly follows, as the regulator producing it is powered. VC3 slowly charges as the capacitor is charged up by current source 16. The low voltage detect signal, LVDTH, follows VCC. The delay time until the reset signal is changed is caused by the charging time of capacitor C3 from the current source 16. At time t2, the reset signal is removed, as VC3 passes the high threshold of comparator 18 of FIG. 1.

At a subsequent time, t3, a power fault is detected, and the LVDTH signal at the input of comparator 12 goes low, indicating that VCC has dropped. In response to this, the latch 14 activates the discharging current source, and the voltage on capacitor C3 begins to decrease, as indicated by signal VC3. If VCC recovers by a time t4, as indicated by dotted lines, the voltage on capacitor C3 will not have passed below the low threshold (LTH) of comparator 18, and no reset signal will be generated. The capacitor then begins to charge up again as indicated by the dotted line.

If, however, the voltage fault continues until a time t6, as indicated by the solid line, VC3 will pass below the low threshold, (LTH) of comparator 18 at a time t5. Thus, a reset signal will be generated at that time.

Figure 3:
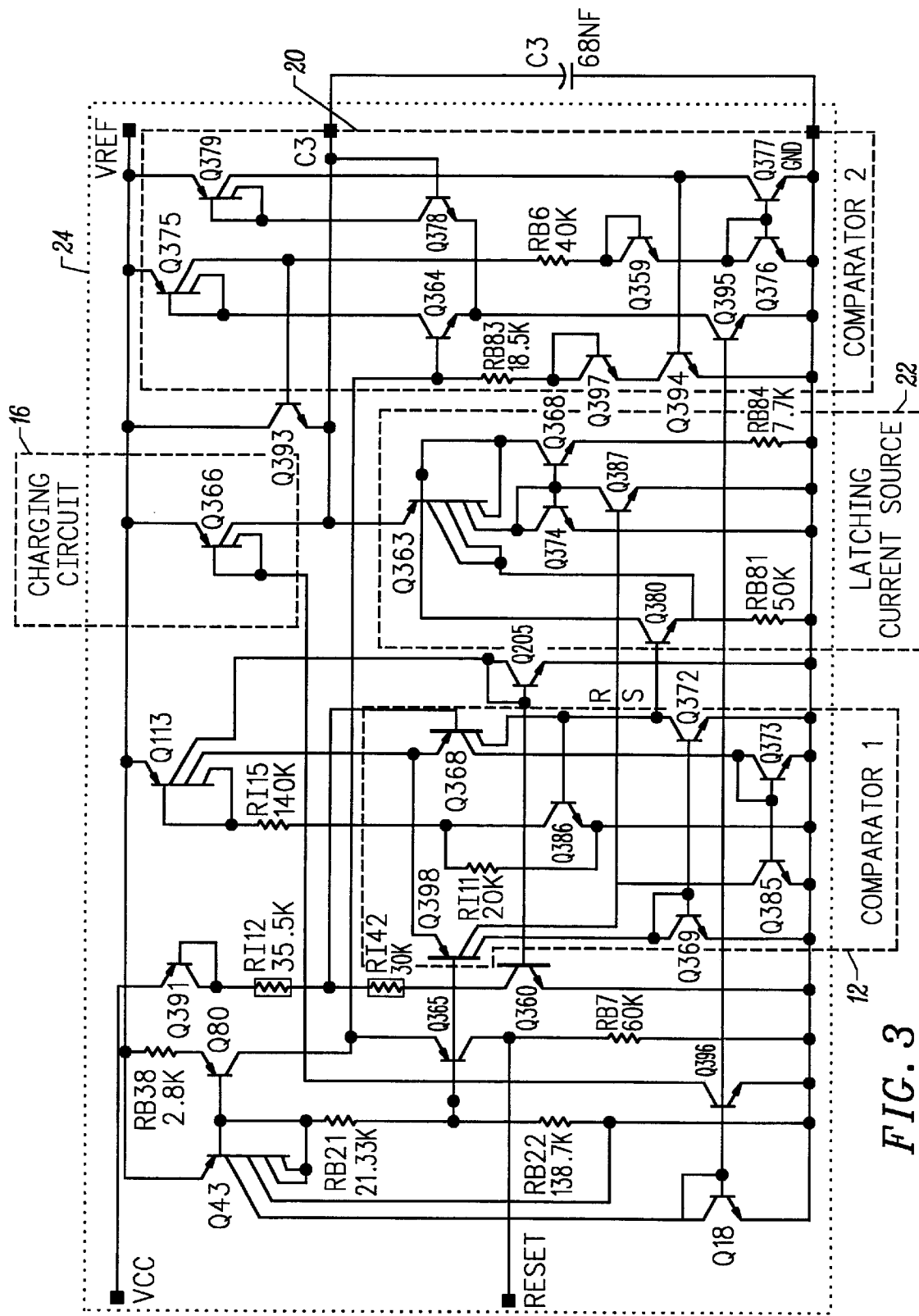
FIG. 3 is a circuit diagram of a preferred embodiment of the reset circuit of FIG. 1, including the latching current source.

FIG. 3 is a circuit diagram illustrated in a preferred embodiment of the reset circuit 10 of FIG. 1. Note that the block diagram is an equivalent representation of the circuit of FIG. 3, and not exact. For example, a latching current source 22 is indicated in FIG. 3, which combines the elements of block 14 and the current source of Q1 and Q2 of FIG. 1. The basic location of the other major elements of FIG. 1 are indicated by dotted lines. Charging circuit 16, the first comparator 12 and the second comparator 20 are shown, as well as external capacitor C3. A dotted line 24 indicates which circuits are preferably integrated on a single silicon substrate. The operation of the circuit of FIG. 3 will now be described.

When the power is turned on, a series resistance of RB22 and RB21 sets up bias currents for Q80 and Q43 PNP current sources. One collector from Q43 is used to bias a Q18 diode-connected NPN transistor, which is used as a reference diode for the Q396 and Q395 NPN current sources. The series resistance of RI11 and RI15 sets up a bias current for the low voltage detect comparator via PNP transistor Q113, configured as a current source. One collector of Q113 sets up the tail current in the input differential pair, transistors Q398 and Q388, and the other collector sets up a voltage reference across resistor RI12 via a Q205/Q360 current mirror. One side of the low voltage detect comparator is connected to RB21/RB22 resistors, which provide the low voltage detect threshold. The other side of the low voltage detect comparator is connected to resistors RI12/RI42 which provide VCC sensing. Under normal conditions the Q388 base resides at the voltage level above Q398's base, forcing Q388 into an off state and Q398 into an on state. The Q398 transistor splits the tail current between a Q369 NPN diode-connected transistor and the Q387 base. Transistor Q387 saturates, forcing the Q374 and Q368 NPN transistors into an off state. Q372's collector mirrors the Q369 current, forcing it to saturate, which causes Q386 and Q380 to turn off. The Q373/Q385 current mirror is off due to Q388 being off. Transistors Q363, Q374, Q368 and resistor RB84 form a constant current source. With the addition of transistors Q380, Q387 and resistor RB81, the current source becomes a latching current source. The Q380 base provides the set input and Q387's base provides the reset input. With Q387 saturated and Q380 in an off state, the latching current source is in an off state. Q396's collector current biases the Q366 PNP current source. One sixth of the Q396 collector current charges the C3 capacitor. The Q393 emitter presets the C3 capacitor voltage at turn on to VBE+200 mV. Q393's base voltage is set to 2VBE+200 mV, which forces Q393 emitter to the C3 preset voltage level of VBE+200 mV. Since the C3 capacitor voltage starts at 0V, the Q364 base voltage rises high until it is clamped by Q365's emitter to 200 mV below the VREF voltage. Since the Q378 base is connected to the C3 capacitor and the Q364 base is connected to the Q365 emitter, Q364 will conduct the entire Q395 collector current. Q364's collector current is mirrored through the Q375 transistor into the RB6 resistor. The current then flows through the Q359 and Q376 diode-connected transistors. Q376's collector current is mirrored by NPN transistor Q377, forcing its collector to saturate since the Q378 and Q379 transistors are turned off. Since Q394's base voltage is forced to near ground, it will be in an off state too. With Q394 off, Q364's base voltage rises high until it is clamped by the Q365 emitter. Transistors Q364, Q378, Q375, Q379, Q376, Q377, Q359, Q394, Q397, resistors RB6 and RB38 and capacitor C3 form the comparator with hysteresis. Capacitor C3 continues to charge until its voltage reaches the Q364 base voltage, at which point the Q378 collector starts to conduct a higher current than the Q364 collector. Since the Q394 base conducts the difference between the Q379 and Q377 collector currents, Q394's base will rise until Q394 turns on, forcing Q364's base to switch low. As the Q364 base switches low, it turns off and Q378 ends up conducting the entire Q395 collector current, which forces the Q364 base low and the Q378 base proceeds to climb until the Q366 transistor saturates, at which point the C3 capacitor stops charging. At this point the entire circuit is in a stable state.

When the VCC voltage drops low such that the Q388 base drops below the Q398 base, the Q387 base switches from high to low releasing the Q374 and Q368 bases. At the same time the Q380 and Q386 bases switch from low to high hence both transistors turn on. Q386 saturates, shorting out the RI11 resistor. With RI11 shorted out, Q113's collectors conduct higher current, forcing a higher voltage drop across the RI12 resistor, which provides positive feedback to the comparator input voltage creating hysteresis at the comparator input. Q380's collector current turns on the Q363 PNP transistor which causes Q374 and Q368 to turn on and Q380 to turn off. Due to Q368 having twice the emitter area of Q374 the current in transistor Q368 will increase until the voltage drop across the RB84 resistor reaches 18 mV, at which point Q368 and Q374 conduct equal currents and the loop reaches stable state. At equilibrium, the Q368 and Q374 transistors conduct currents of 2.5 $\mu$A each, and since each of Q363's collectors conducts equal currents, its emitter will conduct a 10 $\mu$A current, making it look like a fixed current source. Since Q366's collector current is set at 0.83 μA, the C3 capacitor will begin to be discharged at a rate approximately 10 times higher then it was charged at. If the VCC voltage remains low, the C3 capacitor will discharge until it reaches the Q364 base voltage level, at which point Q394 turns off causing the Q364 base voltage to switch to its high threshold level. As Q364's base switches high, the Q365 transistor turns on, causing the RESET voltage to switch from low to high, which provides the output reset signal. The C3 capacitor will continue to discharge until the Q368 transistor saturates. This would be a normal power up-power down sequence. When the power is restored the circuit repeats power on procedures as described in above. On the other hand, if the VCC voltage returns to a level above the low voltage detect threshold before the C3 capacitor voltage reaches the low threshold level, Q385 turns off causing Q387 to turn on, and as Q372 turns on it causes Q386 and Q380 to turn off. Q386 inserts positive feedback at the base of Q388 providing it with hysteresis. Q387 turns off Q374 and Q368 causing the latched current source to switch into its off state since Q380 is also off. Since there is no more discharge current available, C3 starts to charge toward its high voltage level. Note that the comparator never changes state, hence no reset signal is issued. See the waveforms in FIG. 2.

As will be understood by those with skill in the art, the present invention may be embodied in other specific forms without departing from the spirit or essential characteristics thereof. For example, instead of the latching current source of FIG. 3, an actual separate latch and current source could be used. Also, other methods of producing the desired delay, such as a counter, could be used in the circuit of FIG. 1. Accordingly, the above description is meant to be illustrative, but not limiting, of a scope of the invention, which is set forth in the following claims.

What is claimed is:

1. A reset circuit comprising:

a first comparator having inputs coupled to a power supply voltage and a voltage reference, said voltage reference being provided by a separate voltage regulator from said power supply voltage;

a second comparator having a first input coupled to said voltage reference, and an output for generating a reset signal, said reset signal being generated a power interrupt delay period after said power supply voltage falls below said voltage reference, such that no power-on delay is initiated for power interrupts that are shorter than said power interrupt delay period;

a capacitor coupled to a second input of said second comparator;

a charging circuit coupled between said voltage reference and said capacitor; and a discharging circuit, coupled between an output of said first comparator and said capacitor, configured to discharge said capacitor in response to said supply voltage falling below said voltage reference.

2. The circuit of claim 1 wherein said discharging circuit discharges said capacitor faster than said charging circuit charges said capacitor.

3. The circuit of claim 1 wherein said charging circuit is a current source.

4. The circuit of claim 1 wherein said discharging circuit comprises:

a latch coupled to said output of said first comparator; and a current source coupled between an output of said latch and said capacitor.

* * * * *